United States Patent
Yu

(10) Patent No.: US 8,817,860 B2
(45) Date of Patent: Aug. 26, 2014

(54) SYSTEMS AND METHODS FOR PERFORMING PHASE TRACKING WITHIN AN ADC-BASED TUNER

(75) Inventor: Tommy Yu, Orange, CA (US)

(73) Assignee: Entropic Communications, Inc., San Diego, CA (US)

( * ) Notice: Subject to any disclaimer, the term of this patent is extended or adjusted under 35 U.S.C. 154(b) by 0 days.

(21) Appl. No.: 13/609,060

(22) Filed: Sep. 10, 2012

(65) Prior Publication Data

US 2013/0064278 A1 Mar. 14, 2013

Related U.S. Application Data

(60) Provisional application No. 61/533,101, filed on Sep. 9, 2011.

(51) Int. Cl.
*H04B 3/46* (2006.01)

(52) U.S. Cl.
USPC ............................ 375/226; 375/224; 375/231

(58) Field of Classification Search
USPC ........ 375/224, 226, 320; 370/241; 455/67.11, 455/67.7; 702/79
See application file for complete search history.

(56) References Cited

U.S. PATENT DOCUMENTS

| | | | | |
|---|---|---|---|---|
| 6,160,443 A | * | 12/2000 | Maalej et al. | 329/304 |
| 6,985,703 B2 | | 1/2006 | Groe et al. | |
| 2005/0157820 A1 | * | 7/2005 | Wongwirawat et al. | 375/326 |
| 2005/0271161 A1 | | 12/2005 | Staszewki et al. | |
| 2011/0134986 A1 | * | 6/2011 | Skull et al. | 375/229 |

FOREIGN PATENT DOCUMENTS

WO 2013036952 A1 3/2013

OTHER PUBLICATIONS

International Search Report and Written Opinion for International Application PCT/US2012/054500, completed Oct. 24, 2012, 6 pgs.
International Preliminary Report on Patentability for International Application No. PCT/US2012/054500, International Filing Date Sep. 10, 2012, Search Completed Oct. 25, 2012, Date Issued Mar. 12, 2014, 5 pgs.

* cited by examiner

*Primary Examiner* — Dhaval Patel
(74) *Attorney, Agent, or Firm* — Richard Bachand; KPPB LLP

(57) ABSTRACT

Systems and methods for performing phase tracking scheme for an Analog to Digital converter based tuner. In many embodiments, a phase tracking scheme is used that includes a phase locked loop that corrects the phase of the output signals and an amplitude modulation compensator that modulates the amplitude of the output digital signals to compensate for phase noise based upon the received output digital signals.

10 Claims, 5 Drawing Sheets

SYSTEMS AND METHODS FOR PERFORMING PHASE TRACKING WITHIN AN ADC-BASED TUNER

CROSS-REFERENCE TO RELATED APPLICATIONS

The current application claims priority to U.S. Provisional Application No. 61/533,101, entitled "Phase Tracking Scheme for ADC-based Tuner" that was filed on Sep. 9, 2011, the disclosure of which is incorporated herein by reference in its entirety.

FIELD OF THE INVENTION

This invention generally relates to phase synchronization of Radio Frequency (RF) signals received by a tuner. More particularly, this invention generally relates to phase synchronization of received RF signals after the signals have been converted from analog to digital signals in an ADC-based tuner.

BACKGROUND OF THE INVENTION

In many systems, there is often a time invariant frequency and phase difference between the received signals and the output signals as well as a time variant phase difference between the signals. The time invariant frequency and phase differences are commonly attributed to the differences between the transmitter and receiver such as the fixed frequency delta. Time variant phase differences are rapid, short term random fluctuations in the phase of the waveform such as phase noise. One manner in which phase noise may be added to the received signals is through a mixing operation in the tuner.

For coherent reception, synchronization of both the phase and frequency of the received and output signals is used. Typically, the synchronization is performed on an analog form of these signals. FIG. 1 illustrates an embodiment of a conventional prior art analog Phase Locked Loop (PLL) used to synchronize the received RF signals with a local replica. The PLL 100 includes phase detector 105, loop filter 110, and voltage controlled oscillator 115.

The phase detector 105 is a device that produces an error signal. The error signal is a time varying signal that measures the phase difference between the phases of the received RF signals and the local replica. The loop filter 110 governs the response of PLL 100 to the time variations in the error signal. A well designed loop filter tracks the changes in the received signals phase but is not overly responsive to receiver noise. Voltage controlled oscillator 115 receives control signals from loop filter 110 and generates a carrier replica based upon the control signals. The voltage controlled oscillator 115 is an oscillator that provides an output frequency that is a linear function of an input voltage over a specific range of input and output.

Analog to Digital Converters (ADCs) have greatly improved since ADCs were first introduced. Current ADCs can sample signals at multiple GHz speeds and dissipate less power than traditional RF mixer based tuners. As such, ADC based RF tuners, such as the ADC-based tuner shown in FIG. 2, have been developed. The ADC-based tuner 200 shown in FIG. 2 includes a Low Noise Amplifier (LNA) 205, a high-speed ADC 210, channelizer 215, and a high-speed PLL 220. The LNA 205 amplifies received RF signals for analog to digital conversion. The high-speed ADC 210 receives the amplified signals from the LNA 205 and converts the amplified RF signals from analog signals to digital signals. The high-speed ADC 210 is clocked by the high speed PLL 220. The channelizer 215 receives the digital signals from the high-speed ADC 210 and performs mixing and filtering operations in the digital domain to output in-phase (I) signals and a quadrature (Q) signals from the tuner 200. Similar to a traditional RF mixer, phase noise is introduced into the signals by the ADC-based tuner 200.

To synchronize the received signals with the local signals a digital PLL may be added to an ADC-based tuner. An embodiment of a prior art digital PLL is shown in FIG. 3. The illustrated digital PLL 300 includes an ADC 305, a digital mixer 310, a Phase Error Detector (PED) 315, a loop filter 320, a phase accumulator 335, and a Direct Digital Frequency Synthesizer (DDFS) 340. The ADC 300 converts the received analog RF signals into digital signals. The digital mixer 310 performs phase adjustment on the distorted digital signals received from the ADC 300. The PED 315 calculates the phase difference between the incoming signals and the output digital signals output from the digital mixer 310. The phase difference calculated by the PED 315 is then filtered by the loop filter 320 to generate a current intermediate phase adjustment signal. The intermediate phase adjustment signal represents the phase change between the current signal and a previous signal. The phase accumulator 335 then adds a previous intermediate phase adjustment signal to the current intermediate phase adjustment signal to provide the phase adjustment signal which a signal that indicates the phase change needed in the output signals to synchronize the output signal. The DDFS 340 receives the phase adjustment signal and generates a phase adjustment estimation used by mixer 310 to perform the phase adjustment of the output digital signals. However, the phase noise from the PLL of an ADC-based tuner amplitude and phase modulates the received signals in the digital domain instead of phase modulating the signals as happens in the analog domain. A digital PLL 300 can only correct for the phase modulation, not amplitude modulation. The un-tracked amplitude modulation can cause significant performance degradation for a receiver.

SUMMARY OF THE INVENTION

Systems and methods for providing a phase tracking scheme for an ADC-based tuner are disclosed in accordance with embodiments of this invention. In accordance with embodiments of this invention, systems and methods for providing a phase tracking scheme for an ADC-based tuner include a digital mixer, a digital PLL, and an amplitude modulation compensator. The digital signal mixer receives digital signals from an ADC based tuner and mixes the received digital signals with a phase adjustment estimation signal to provide output digital signals. The digital PLL receives output digital signals from the digital signal mixer and provides the phase adjustment estimation signal to the digital signal mixer based upon the output digital signals. The amplitude modulation compensator receives the output digital signals from the digital signal mixer and modulates the amplitude of the output digital signals based upon the received output digital signals to compensate for amplitude modulation from phase noise.

In accordance with some embodiments of the invention, amplitude modulation compensator includes an amplifier, a phase error detector, and a gain adjustment loop. The amplifier receives the output digital signals from the digital signal mixer and amplifies the output digital signals based upon a gain adjustment signal. The phase error detector receives the output digital signals from the amplifier and outputs an amplitude detection error signal based upon the output digital signals. The gain adjustment loop receives the amplitude detection error signal from the phase error detector and generates the gain adjustment signal based upon the amplitude detection error signal.

In accordance with some embodiments, the gain adjustment loop is a first order loop. In accordance with some of these embodiments, the first order loop includes a multiplier and an accumulator. In accordance with other embodiments, the gain adjustment loop is a second order loop. In accordance with some of these embodiments, the second order loop includes a first multiplier, a second multiplier, a first accumulator, an adder, and a second accumulator. The first multiplier multiplies the amplitude detection error signal with a first coefficient also known as a linear coefficient to provide a first amplitude phase adjustment error signal. The second multiplier multiplies the amplitude detection error signal with a second coefficient also known as an integral coefficient to provide a current intermediate second amplitude phase adjustment error signal. The first accumulator adds a previous second amplitude phase adjustment error signal to the current intermediate second amplitude phase adjustment error signal to provide a second amplitude phase adjustment error signal. The adder adds the first amplitude phase adjustment error signal and second amplitude phase adjustment error signal to provide a current intermediate gain adjustment signal. The second phase accumulator receives the current intermediate gain adjustment signal from the adder and adds a previous intermediate gain adjustment signal to the intermediate gain adjustment signal to provide the gain adjustment signal.

In accordance with some of these embodiments, the phase error detector also provides a phase detection error signal for the output digital signals; and the PLL includes a loop filter, a phase accumulator, and a DDFS. The loop filter receives the phase detection error signal from the phase error detector and outputs a current intermediate phase corrected signal based upon the phase detection error signal. The phase accumulator receives the current intermediate phase corrected signal from loop filter and adds a previous intermediate phase corrected signal to the current intermediate phase corrected signal to provide the phase corrected signal. The DDFS then receives the phase corrected signal from the phase accumulator and provides the phase adjustment estimation signal based upon the phase corrected signal.

DETAILED DISCLOSURE OF THE INVENTION

Turning now to the drawings, systems and methods for performing phase tracking within an ADC-based tuner are described in accordance with embodiments of this invention. In accordance with embodiments of this invention, the phase tracking scheme for an ADC tuner may track fast changing amplitude modulation of the signals due to phase noise introduced in by a PLL in an ADC-based tuner. The phase tracking scheme in accordance with many embodiments of this invention may track amplitude modulation impairment in the receiver system. Higher gain tracking over a traditional AGC loop may and/or higher gain tracking than a traditional adaptive equalizer may also result through using a phase tracking scheme in accordance with embodiments of this invention. Systems and methods for performing phase tracking within an ADC-based tuner in accordance with embodiments of the invention are discussed further below.

Phase Tracking Scheme Architecture

Figure 1:
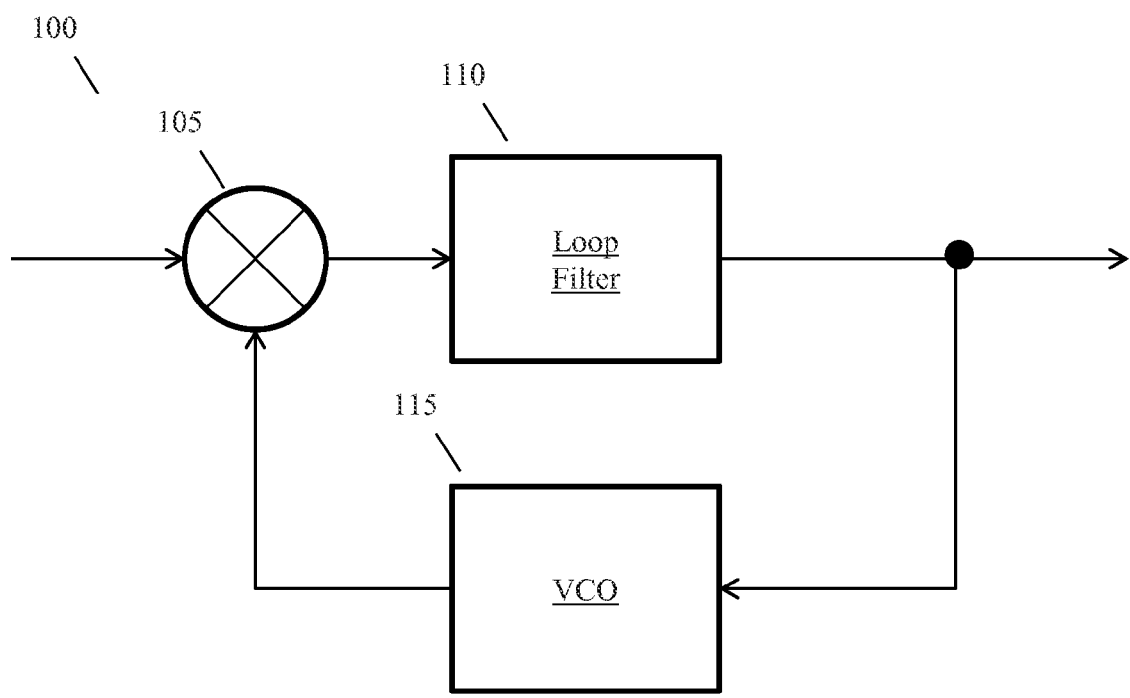
FIG. 1 illustrates an embodiment of a prior art phase locked loop.
Figure 2:
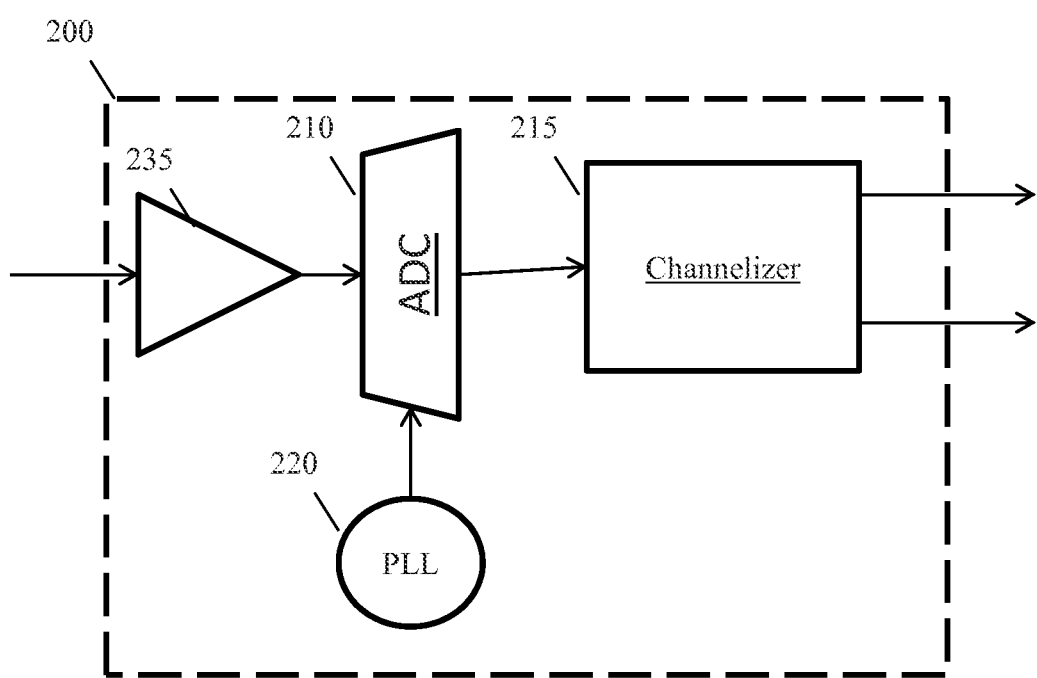
FIG. 2 illustrates an embodiment of a prior art ADC-based tuner.
Figure 3:
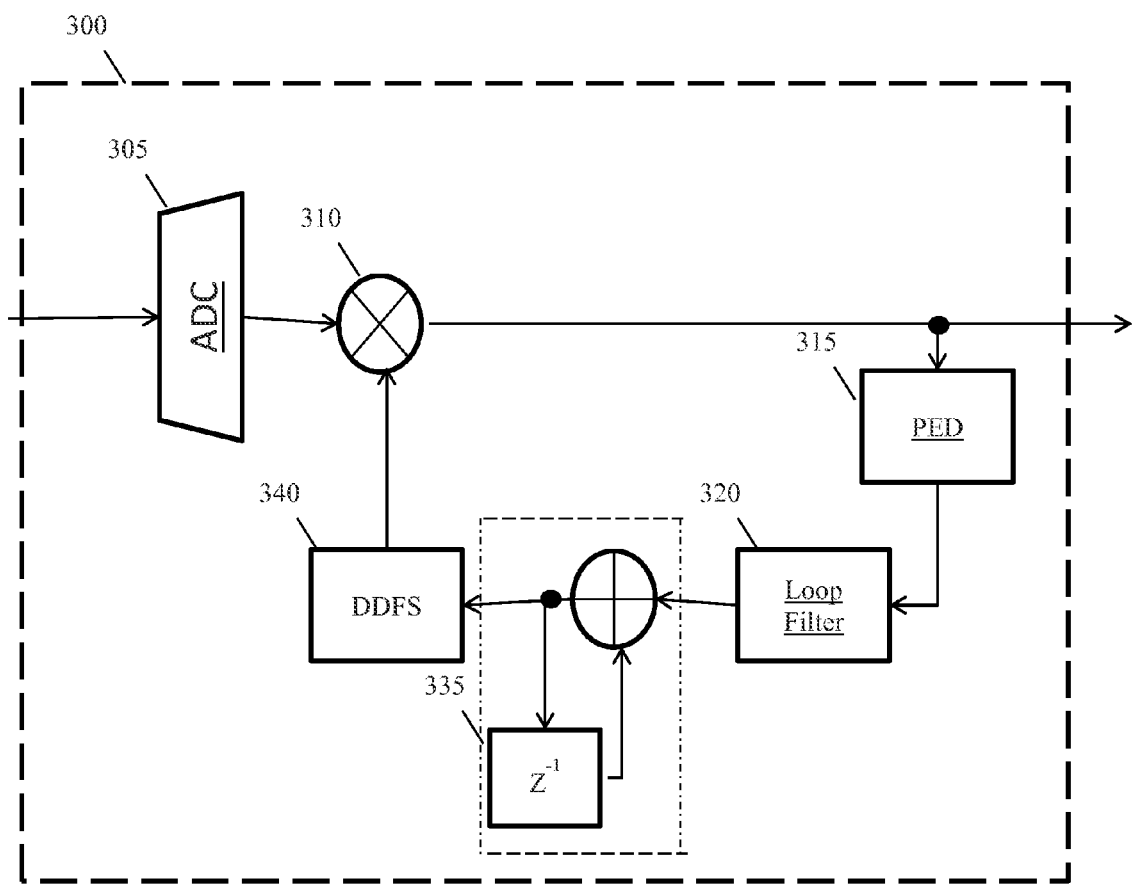
FIG. 3 illustrates an embodiment of a digital phase locked loop.
Figure 4:
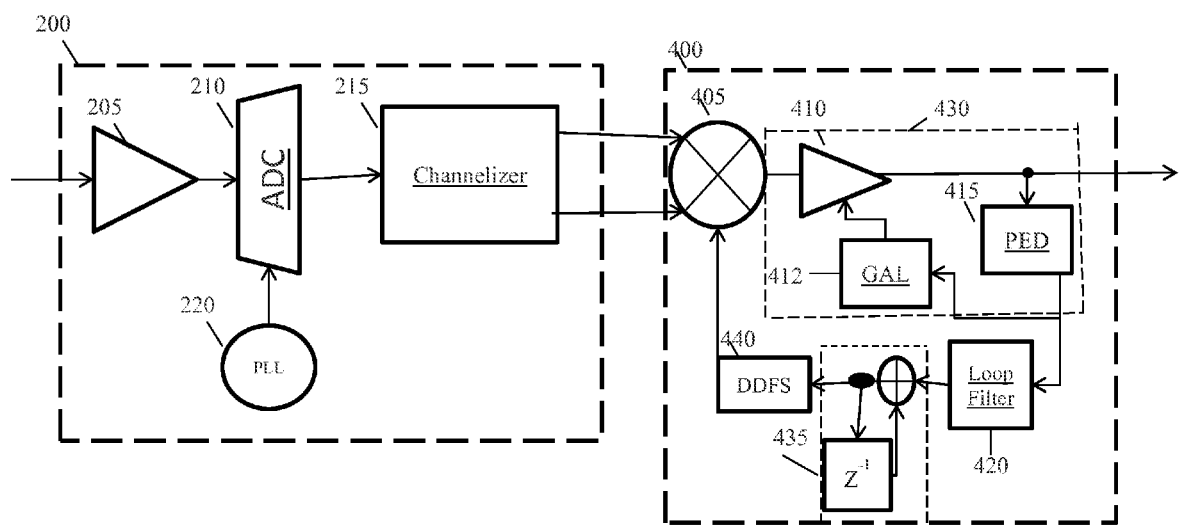
FIG. 4 illustrates a digital phase locked loop that is configured to receive signals from an ADC-based tuner in accordance with embodiments of this invention.

A phase tracking architecture for an ADC-based tuner in accordance with an embodiment of this invention is shown in FIG. 4. In accordance with many embodiments of this invention, the phase tracking architecture includes a conventional phase locked loop and an amplitude modulation compensator. The phase locked loop adjusts the digital signals to correct phase error and the amplitude modulation compensator corrects for amplitude modulation of the digital signals caused by phase noise, such as phase noise introduced by the PLL in an ADC-based tuner. One skilled in the art will recognize that embodiments of this architecture may be implemented as hardware, software, or firmware without departing from the invention. Furthermore, one skilled in the art will recognize that the scheme in accordance with this invention may be combined with other gain adjustment stages in the receiver architecture without departing from this invention In FIG. 4, an ADC-based tuner 200, as described above with reference to FIG. 2 is shown. The phase tracking architecture 400 of the ADC-based tuner 200 receives signals from ADC-based tuner 200. The phase tracking architecture 400 includes a digital mixer 405, an amplifier 410, a Gain Adjustment Loop (GAL) 412, a Phase Error Detector (PED) 415, a loop filter 420, a phase accumulator 435, and a DDFS 440. The amplitude modulation compensator 430 includes an amplifier 401, a GAL 412, and a PED 415. The phase locked loop includes a PED 415, a loop filter 420, a phase accumulator 435, and a DDFS 440. One skilled in the art will understand that the amplitude modulation compensator may also be implemented prior to the phase adjustment in other embodiments of this invention.

In operation, the digital mixer 405 receives digital signals from the ADC based tuner 200 and mixes the received digital signals with a phase adjustment estimation signal to provide output digital signals. In particular, the digital mixer 405 receives the I and Q signals produced by the channelizer 215 of the ADC-based tuner 200. The amplifier 410 of the amplitude modulation compensator 430 receives the output digital signals from the digital mixer 405 and amplifies the output digital signals based upon a gain adjustment signal (see below) to generate the digital signals output by the phase tracking architecture 400. The PED 415 receives the output digital signals from the amplifier 410. Based upon the output digital signals received from the amplifier 410, the PED 415 produces an amplitude detection error signal for the amplitude modulation compensator 430 and produces a phase detection error signal for the PLL. In amplitude modulation compensator 430, the GAL 412 receives the amplitude detection error signal and generates the gain adjustment signal based upon the amplitude detection error for use by amplitude modulation compensator 430 to modulate the output signals.

In the PLL, the loop filter 420 receives the phase detection error from the PED 415 and outputs a current intermediate phase corrected signal based upon the phase detection error. The accumulator 435 then adds a previous intermediate phase corrected signal to the current intermediate phase corrected signal to provide the phase corrected signal. The DDFS 440 receives the phase corrected signal and generates a phase adjustment estimation signal used by the mixer 405 to perform the phase adjustment based the phase corrected signal.

Gain Adjustment Loop

Figure 5:
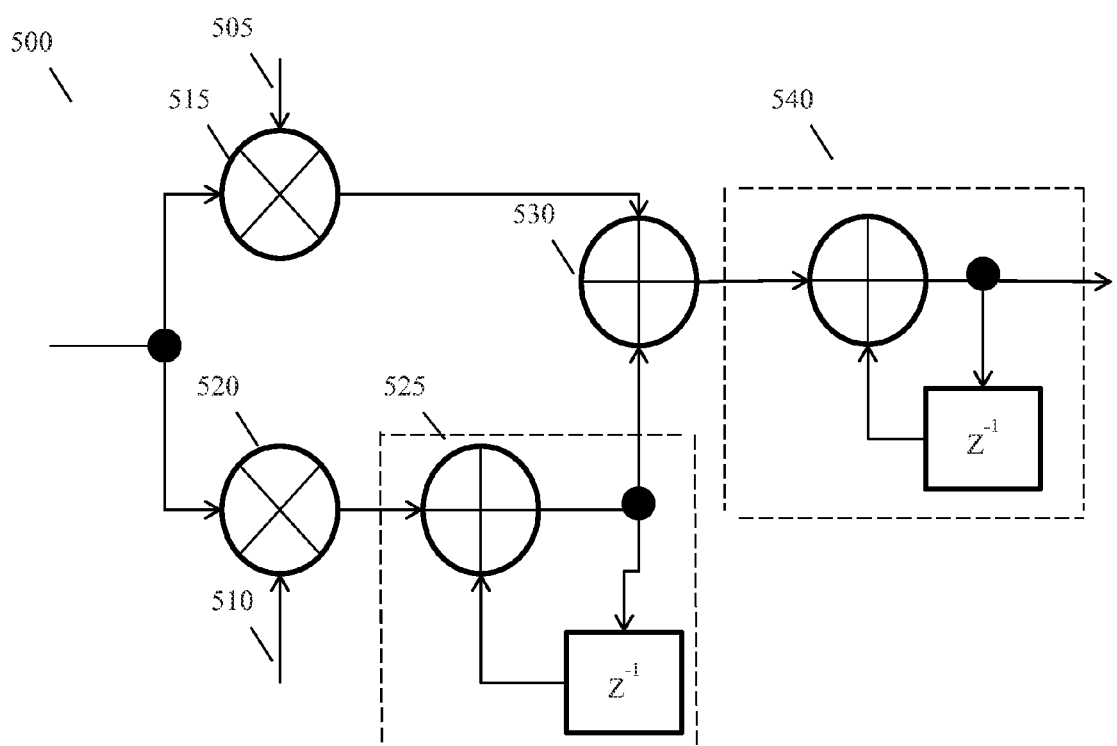
FIG. 5 illustrates a $2^{nd}$ order gain adjustment in accordance with embodiments of this invention.

A GAL of an amplitude modulation compensator configured to generate a gain adjustment signal in accordance with an embodiment of the invention is shown in FIG. 5. The GAL 500 is a second order loop. However, one skilled in the art will recognize that the GAL may be implemented as a first order loop, such as a multiplier and an accumulator, and/or as any other form of higher order loop appropriate to the requirements of a specific application. The GAL 500 includes a first multiplier 515, a second multiplier 520, a first accumulator 525, a first adder 530, and a second accumulator 540.

The first multiplier 515 multiplies the amplitude detection error from the PED with a first coefficient 505 also known as a linear coefficient to provide a first amplitude adjustment error signal. The second multiplier 520 multiplies the amplitude detection error from the PED with a second linear coefficient 510 to provide a current intermediate second amplitude adjustment error signal. The first accumulator 525 receives the current intermediate second amplitude adjustment signal from the second multiplier 520 and adds a previous intermediate second amplitude adjustment error signal to the current intermediate second amplitude adjustment error signal to produce the second amplitude adjustment error signal.

The adder 530 receives the first and second amplitude adjustment error signals and adds the first and second amplitude adjustment error signals to provide a current intermediate gain adjustment signal. The second accumulator 540 receives the current intermediate gain adjustment signal from the adder 530 and adds a previous intermediate gain adjustment signal to the current intermediate gain adjustment signal to provide the gain adjustment signal.

Although specific implementations of phase tracking architectures and gain adjustment loops are discussed above, any of a variety of phase tracking architectures and/or gain adjustment loops can be utilized to compensate for amplitude modulation error in a received signal caused by phase noise in a PLL as appropriate to the requirements of a specific application in accordance with embodiments of the invention.

The above is description of embodiments of systems and methods in accordance with the present invention. It is foreseen that other skilled in the art will design alternative systems that infringe on this invention as set forth in the following claims either literally or through the Doctrine of Equivalents.

What is claimed is:

1. An Analog to Digital Converter (ADC) based tuner comprising:
 a low noise amplifier that amplifies a received analog signal;
 an ADC that receives the received analog signal and converts the received analog signal to a received digital signal;
 a Phase Locked Loop (PLL) that provides a clock signal to the ADC;
 a channelizer that receives the received digital signal from the high-speed ADC and performs mixing and filtering operations on the received digital signals in the digital domain;
 a digital signal mixer that receives the received digital signal from the channelizer and mixes the received digital signals with a phase adjustment estimation signal to provide an output digital signal;
 a digital phase lock loop that receives the output digital signal from the digital signal mixer and provides the phase adjustment estimation signal to the digital signal mixer based upon the output digital signal; and
 an amplitude modulation compensator that receives the output digital signal from the digital signal mixer and modulates the amplitude of the output digital signal to compensate for amplitude modulation from phase noise, including phase noise due to the PLL, based upon the received output digital signal wherein the amplitude modulation compensator comprises:
  an amplifier that receives the output digital signal from the digital signal mixer and amplifies the output digital signal based upon a gain adjustment signal,
  a phase error detector that receives the output digital signal from the amplifier and outputs an amplitude detection error signal, and
  a gain adjustment loop that receives the amplitude detection error signal from the phase error detector and generates the gain adjustment signal based upon the amplitude detection error signal.

2. The phase tracking scheme of claim 1 wherein the gain adjustment loop comprises a first order loop.

3. The phase tracking scheme of claim 2 wherein the first order loop comprises an multiplier and an accumulator.

4. The phase tracking scheme of claim 1 wherein the gain adjustment loop comprises a second order loop.

5. The phase tracking scheme of claim 4 wherein the second order loop comprises:
 a first multiplier that multiplies the amplitude detection error with a linear coefficient to provide a first amplitude adjustment error signal;
 a second multiplier that multiplies the amplitude detection error with an integral coefficient to provide a current intermediate second amplitude adjustment error signal;
 a first accumulator that receives the current intermediate second amplitude adjustment signal and adds a previous intermediate second amplitude adjustment error signal to the current intermediate second amplitude adjustment error signal to produce a second amplitude adjustment error signal;
 an adder that adds the first amplitude adjustment error signal and the second amplitude adjustment error signal to provide a current intermediate gain adjustment signal; and
 a second accumulator that receives the current intermediate gain adjustment signal from the adder and adds a previous intermediate gain adjustment signal to the current intermediate gain adjustment signal to provide the gain adjustment signal.

6. The phase tracking scheme of claim 1 wherein the phase error detector also provides a phase detection error signal of the output digital signals and the phase lock loop comprises:
 a loop filter that receives the phase detection error signal from the phase error detector and outputs a current intermediate phase corrected signal based upon the phase detection error signal;
 an accumulator that receives the current intermediate phase corrected signal from the loop filter and adds a previous intermediate phase corrected signal to the current intermediate phase corrected signal to provide a phase corrected signal; and
 a direct digital frequency synthesizer that receives the phase corrected signal from the phase accumulator and provides the phase correction signal based upon the phase corrected signal.

7. A method of performing phase tracking within an Analog to Digital Converter (ADC) based tuner comprising:
- receiving a digital signal from an ADC based tuner;
- mixing the received digital signal with a phase adjustment estimation signal to provide an output digital signal;
- generating the phase adjustment information signal for mixing with the received digital signal based upon the output digital signal; and
- modulating the amplitude of the output digital signal to compensate for amplitude modulation from phase noise based upon the received output digital signals, wherein the modulating of the amplitude of the output signal comprises:
  - amplifying the output digital signal based upon a gain adjustment signal,
  - determining an amplitude detection error signal from the output digital signal, and
  - generating the gain adjustment signal based upon the amplitude detection error signal.

8. The method of claim 7 wherein the generating of the gain adjustment signal comprises:
- multiplying the amplitude detection error signal with a linear coefficient to provide a first amplitude phase adjustment error signal;
- multiplying the amplitude detection error signal with an integral coefficient to provide a current intermediate second amplitude adjustment error signal;
- adding a previous intermediate second amplitude adjustment error signal to the current intermediate second amplitude adjustment error signal to produce the second amplitude adjustment error signal;
- adding the first amplitude adjustment error signal and the second amplitude adjustment error signal to provide a current intermediate gain adjustment signal; and
- adding a previous intermediate gain adjustment signal to the current intermediate gain signal to provide the gain adjustment signal.

9. The method of claim 7 wherein the generating of the phase correction signal comprises:
- determining a phase detection error signal from the output digital signals;
- generating a current intermediate phase corrected signal based upon the phase detection error signal;
- adding a previous intermediate phase corrected signal to the current intermediate phase corrected signal to provide a phase corrected signal; and
- providing the phase adjustment estimation signal based upon the phase corrected signal.

10. The method of claim 7 further comprising:
- receiving an analog signal; and
- converting the received analog signal to a received digital signal using an ADC that receives a clock signal from a Phase Locked Loop (PLL) wherein the PLL introduces phase noise that modulates the digital signal.

* * * * *

UNITED STATES PATENT AND TRADEMARK OFFICE
CERTIFICATE OF CORRECTION

PATENT NO. : 8,817,860 B2
APPLICATION NO. : 13/609060
DATED : August 26, 2014
INVENTOR(S) : Tommy Yu It is certified that error appears in the above-identified patent and that said Letters Patent is hereby corrected as shown below:

In the Claims

Column 6, Claim 3, line 26, after "comprises" delete "an" and add --a--.

Signed and Sealed this
Thirtieth Day of June, 2015

Michelle K. Lee
*Director of the United States Patent and Trademark Office*